United States Patent
Arai et al.

(10) Patent No.: US 8,860,014 B2
(45) Date of Patent: Oct. 14, 2014

(54) ORGANIC ELECTROLUMINESCENT MEMBER AND METHOD FOR PRODUCING ORGANIC ELECTROLUMINESCENT ELEMENT

(75) Inventors: Kenji Arai, Kunitachi (JP); Toshihiko Iwasaki, Hino (JP)

(73) Assignee: Konica Minolta Holdings, Inc. (JP)

( * ) Notice: Subject to any disclaimer, the term of this patent is extended or adjusted under 35 U.S.C. 154(b) by 62 days.

(21) Appl. No.: 13/581,430

(22) PCT Filed: Jan. 31, 2011

(86) PCT No.: PCT/JP2011/051878
§ 371 (c)(1),
(2), (4) Date: Aug. 27, 2012

(87) PCT Pub. No.: WO2011/111438
PCT Pub. Date: Sep. 15, 2011

(65) Prior Publication Data
US 2012/0319139 A1    Dec. 20, 2012

(51) Int. Cl.
*H01L 29/08* (2006.01)
*H01L 51/50* (2006.01)
*H01L 51/00* (2006.01)

(52) U.S. Cl.
CPC ......... *H01L 51/5092* (2013.01); *H01L 51/0081* (2013.01); *H01L 51/002* (2013.01)
USPC ...... 257/40; 257/643; 257/759; 257/E51.024; 438/82; 438/99

(58) Field of Classification Search
USPC ............... 257/40, 642, 643, 459, E51.024, 257/E51.018, E51.002, E51.001; 438/82, 438/89
See application file for complete search history.

(56) References Cited

U.S. PATENT DOCUMENTS

2006/0251922 A1\* 11/2006 Liao et al. ............... 428/690
2010/0219398 A1\* 9/2010 Furukawa et al. ......... 257/40

FOREIGN PATENT DOCUMENTS

| JP | 09-017574 A | 1/1997 |
| JP | 11-354283 A | 12/1999 |
| JP | 2000-164360 A | 6/2000 |
| JP | 2004-002297 A | 1/2004 |
| JP | 2004-303528 A | 10/2004 |
| JP | 2006-286242 A | 10/2006 |
| JP | 2007-109629 A | 4/2007 |

(Continued)

OTHER PUBLICATIONS

International Search Report for International Application No. PCT/JP2011/051878 mailing date of Mar. 29, 2011 with English translation.

(Continued)

*Primary Examiner* — Su Kim
(74) *Attorney, Agent, or Firm* — Cantor Colburn LLP

(57) ABSTRACT

An organic electroluminescent member comprising: a positive electrode and a negative electrode on a substrate: multiple organic layers which include at least a positive hole transport layer, a light-emitting layer and an electron transport layer, and which are arranged between the positive electrode and the negative electrode; and an electron injection layer arranged between the electron transport layer and the negative electrode. The electron injection layer is formed from at least one selected from the group consisting of alkali metals and compounds containing alkali metals having a melting point of less than 90° C., and at least one selected from the group consisting of alkali metals, alkaline earth metals, compounds containing alkali metals, and compounds containing.

5 Claims, 2 Drawing Sheets

(56) References Cited

FOREIGN PATENT DOCUMENTS

| JP | 2007-220319 A | | 8/2007 |
|---|---|---|---|
| JP | 2007-299828 A | | 11/2007 |
| JP | 2008-098475 A | | 4/2008 |
| JP | 2009-182288 A | | 8/2009 |
| WO | WO2007077715 | * | 7/2007 |
| WO | 2009/107187 A1 | | 9/2009 |

OTHER PUBLICATIONS

Notification for Reasons of Rejections for Japanese patent application No. 2012-5043557, dated May 27, 2014. English translation attached.

* cited by examiner

ORGANIC ELECTROLUMINESCENT MEMBER AND METHOD FOR PRODUCING ORGANIC ELECTROLUMINESCENT ELEMENT

CROSS REFERENCE TO RELATED APPLICATIONS

This is a U.S. national stage of application No. PCT/JP2011/051878, filed on 31 Jan. 2011. Priority under 35 U.S.C. §119(a) and 35 U.S.C. §365(b) is claimed from Japanese Application No. 2010-051518, filed 9 Mar. 2010, the disclosure of which are also incorporated herein by reference.

TECHNICAL FIELD

The present invention relates to a novel organic electroluminescence member, and a method for producing an organic electroluminescence element using the same.

BACKGROUND

Conventionally, it is known an electroluminescence display (hereinafter, referred to as an ELD) as an emission type electronic display device. As a composing element of an ELD, there are cited an inorganic electroluminescence element (hereinafter, referred to as an inorganic EL element) and an organic electroluminescence element (hereinafter, referred to as an organic EL element).

An inorganic EL element has been utilized mainly as a flat light source, however, it requires a high voltage of alternating current to drive an emission element. On the other hand, an organic EL element is an element provided with a constitution comprising an light emitting layer containing a light emitting substance being sandwiched with a cathode and an anode, and an exciton is generated by an electron and a hole being injected into the light emitting layer to be recombined, resulting light emission utilizing light release (fluorescence or phosphorescence) at the time of deactivation of the exciton; the light emission is possible at a voltage of approximately a few to a few tens volts, and an organic EL element is attracting attention with respect to such as wide viewing angle and high visual recognition due to a self-emission type as well as space saving and portability due to a completely solid element of a thin layer type.

Moreover, an organic EL device has a distinctive feature of being a surface light, which is different from the main light sources, for example, a light-emitting diode and a cold cathode tube having been conventionally used. As applications which can effectively utilize this property, there are a light source for illumination and a back light of various displays. Especially, it is suitable to use as a back light of a full color liquid crystal display the demand of which has been increased remarkably in recent years.

When an organic EL element is used as a back light of a display or a light source for illumination as described above, there are required to have high light emission efficiency and a long emission lifetime. As a means to improve emission efficiency and to realize a longer emission lifetime, there is proposed a method in which organic functional layers (hereafter they are called as organic layers) composing an organic EL element are prepared by laminating a plurality of layers each having a different function. For example, it can be cited a layer composition of: hole transport layer/light emitting layer/electron transport layer/electron injection layer.

Moreover, the material used as a cathode of an organic EL element is required to inject many electrons into a light emitting layer. Therefore, a metal, such as aluminum, magnesium, indium, silver, or copper, is used so that it may be easy to carry out electron injection to the lowest unoccupied molecular orbital (LUMO) energy level of an organic material.

Furthermore, as a means to improve the electronic injection efficiency from a cathode to an organic layer, there is widely performed the following: preparing a layer containing an alkali metal or an alkali earth metal having a small work function, or a compound having these metals, between a cathode and an organic light emission layer. However, an alkali metal and an alkali earth metal, in particular, an alkali metal has a high reactivity, and there was difficulty in handling at the time of production of an organic EL element and in stability after the production of an organic EL element.

Against the above-mentioned problems, there was disclosed a technology to improve the light emitting property by providing with an electron injection layer composed of an alkali metal compound such as an oxide, a halide or a nitride, the electron injection layer being located at the place adjacent to the side of a cathode facing to an organic layer (for example, refer to Patent document 1). Since a chemically more stable alkali metal compound than an alkali metal is used with this technology, handling is easier and it is possible to produce an element with high reproduction stably using a vapordepositing method, for example. However, although it improves to some extent a luminescent property and a lifetime, still it is insufficient. On the other hand, it has problems that deterioration of efficiency and deterioration of lifetime will occur under a high temperature condition, or during a prolonged storage time. It is supposed as a cause that an alkali metal compound will diffuse to a light emitting layer under a high temperature condition or during a prolonged storage time.

As a means to improve the above-described situation, there were proposed the following technologies: an organic EL element provided with an electron injection layer containing an electron injection material and a first metal atom, and an electron transport layer containing an electron transport material and a second metal atom, the second metal atom being difficult to diffuse compared with the first metal atom, thereby the diffusion of the first metal atom is prevented (for example, refer to Patent document 2); an organic EL element provided with a transition preventing layer containing an organic compound which inhibits the passage of an electron donating material, the transition preventing layer being located at an interface of the light emitting layer facing the electron injection layer mixed with the electron donating material (for example, refer to Patent document 3); an organic EL element provided with a dopant diffusion preventing layer containing a metal fluoride and an organic conductive material, the dopant diffusion preventing layer being located between the electron injection layer doped with electrons and the light emitting layer (for example, refer to Patent document 4); and an organic EL element provided with an electron injection layer composed of a first electron injection layer and a second electron injection layer, the first electron injection layer containing an organic compound, and an alkali metal, an alkali earth metal or a compound of these metals, and the second electron injection layer containing and an alkali metal, an alkali earth metal or a compound of these metals (for example, refer to Patent document 5). All of these technologies are concerned with: a method to provide an interlayer containing an organic compound having a diffusion preventive property so as to prevent diffusion of an electron injective dopant (such as an alkali metal) from the electron injective region; or a method to prevent diffusion by arranging the position of a dopant containing layer in considering of the diffusion easiness or difficulty of an electron injective dopant. Although it can improve, to some extent, deterioration of performance under a high temperature condition, or during a prolonged storage time, still it is insufficient. There is a case in which occurs an increase of a driving voltage depending on the composition of a diffusion preventing layer, an organic material and an electron injective dopant. It is still difficult for a current status to reconcile the performance and the stability of an organic EL element.

Further, in the organic EL element which is subject to a heat aging treatment for the purpose of improving the stability of the performance, or in the organic EL element which is subjected to heat curing using a heat curing resin with a sealing member known as one of the promising method to realize a large sized element and to improve production efficiency, it is required to provide an organic El element which can suitably control the thermal diffusion of the electron injective dopant and can exhibits a stable emission property with a low driving voltage and with a high emission efficiency and long lifetime.

PRIOR ART DOCUMENTS

Patent Documents

Patent document 1: Japanese Patent No. 3529543
Patent document 2: Japanese Patent Application Publication (JP-A) No. 2009-182288
Patent document 3: WO 2009/107187
Patent document 4: JP-A No. 2008-98475
Patent document 5: JP-A No. 2007-299828

SUMMARY OF THE INVENTION

Problems to be Solved by the Invention

The present invention was made in view of the above-mentioned problems. An object of the present invention is to provide an organic EL member excellent in thermal stability, capable of being driven at a low voltage and exhibiting high luminance and long emission lifetime, and to provide a method for producing an organic electroluminescence element employing the organic EL member.

Means to Solve the Problems

An object of the present invention described above has been achieved by the following constitutions.
1. An organic electroluminescence member comprising a substrate havening thereon an anode, a cathode, a plurality of organic layers including a hole transport layer, a light emitting later and an electron transport layer, the plurality of organic layers being sandwiched between the anode and the cathode, and an electron injection layer located between the electron transport layer and the cathode,
  wherein the electron injection layer is formed with:
    at least one selected from the group consisting of an alkali metal having a melting point of less than 90° C. and a compound containing an alkali metal having a melting point of less than 90° C.; and
    at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more.

2. The organic electroluminescence member described in the aforesaid item 1,
  wherein the electron injection layer is composed of a first electron injection layer and a second electron injection layer: the first electron injection layer being formed of at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more; and the second electron injection layer being formed of at least one selected from the group consisting of an alkali metal having a melting point of less than 90° C. and a compound containing an alkali metal having a melting point of less than 90° C.

3. The organic electroluminescence member described in the aforesaid item 2,
  wherein the first electron injection layer is formed adjacent to the electron transport layer at a side near to the cathode, and the second electron injection layer is formed between the first electron injection layer and the cathode.

4. The organic electroluminescence member described in any one of the aforesaid items 1to 3,
  wherein a heat treatment is carried out to the organic electroluminescence member after forming the electron injection layer, or after forming the cathode, the heat treatment being carried out at a temperature of 80° C. or more and below a glass transition temperature of an organic material used in the organic layer.

5. A method for producing an organic electroluminescence element comprising the steps of:
  pasting together a sealing member having a heat curable adhesive agent on a sealing substrate with the organic electroluminescence member described in any one of the aforesaid items 1 to 4 in a manner that a surface of the heat curable adhesive agent have contact with a surface of the cathode of the organic electroluminescence member;
  carrying out a heat treatment at a temperature of 80° C. or more and below a glass transition temperature of an organic material used in the organic layer; then
  curing the heat curable adhesive agent to form a close-contact sealing structure.

Effects of the Invention

By the present invention, it has been achieved to provide an organic EL member excellent in thermal stability, capable of being driven at a low voltage and exhibiting high luminance and long emission lifetime, and to provide a method for producing an organic electroluminescence element employing the organic EL member.

EMBODIMENTS TO CARRY OUT THE INVENTION

The embodiments to carry out the present invention will be detailed in the following.

As a result of an extensive investigation by the present inventors, the present invention was achieved by the following organic electroluminescence member excellent in thermal stability, capable of being driven at a low voltage and exhibiting high luminance and long emission lifetime. This organic electroluminescence member is characterized in having a substrate havening thereon an anode, a cathode, a plurality of organic layers including a hole transport layer, a light emitting later and an electron transport layer, the plurality of organic layers being sandwiched between the anode and the cathode, and an electron injection layer located between the electron transport layer and the cathode, wherein the electron injection layer is formed with: at least one selected from the group consisting of an alkali metal having a melting point of less than 90° C. and a compound containing an alkali metal having a melting point of less than 90° C.; and at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more.

[Organic Electroluminescence Member]

An organic electroluminescence member of the present invention is a structure which has a substrate havening thereon an anode, a cathode, and a plurality of organic layers sandwiched between the anode and the cathode, the plurality of organic layers including a light emitting layer. An organic electroluminescence element of the present invention is a structure which is produced by sealing the organic electroluminescence member with a sealing member.

Although the embodiments of the present invention will be described by referring to FIG. 1 and FIG. 2, the present invention is not limited only to these-illustrated structures.

Figure 1:
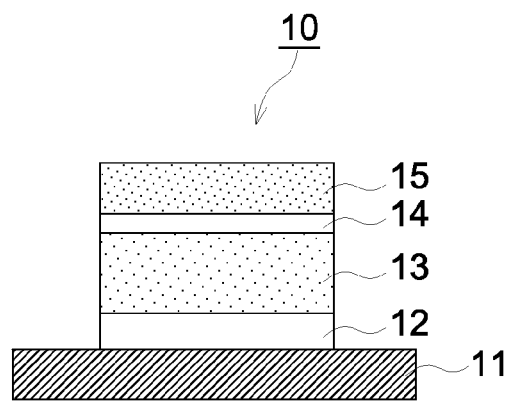
FIG. 1 is a schematic cross sectional view illustrating an example of compositions of an organic electroluminescence member.

FIG. 1 is a schematic cross sectional view illustrating an example of compositions of an organic electroluminescence member (hereafter, it is also called as an organic EL member).

In FIG. 1, an organic EL member 10 is composed of: a substrate 11, an anode 12, an organic layer 13 composed of a plurality of layers including a hole transport layer, a light emitting layer and an electron transport layer, an electron injection layer 14 relating to the present invention, and a cathode 15.

(Electron Injection Layer)

In the organic EL member of the present invention, the electron injection layer 14 is characterized in being formed with: at least one selected from the group consisting of an alkali metal having a melting point of less than 90° C. and a compound containing an alkali metal having a melting point of less than 90° C.; and at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more.

Examples of an alkali metal and an alkali earth metal each having a melting point of 90° C. or more are as follows. As an alkali metal, it can be selected from: Li (180.5° C.) and Na (97.8° C.). Any alkali earth metals can be selected since the melting point of any alkali earth metal elements is 90° C. or more. As an alkali metal having a melting point of less than 90° C., although it can be cited: K (63.2° C.), Rb (39.0° C.), Cs (28.5° C.), and Fr (26.8° C.; estimated value), practically, it is preferable to select from the group consisting of K, Rb, and Cs by considering the stability of the metal element.

Further, from the viewpoint of improving an electron injecting property, it is preferable to select form an alkali metal and an alkali earth metal each having a work function of less than 4.0 eV.

In the present invention, as an alkali metal and an alkali earth metal, although it can be used each simple metal element or a compound containing these elements, preferably used in the present invention is a compound containing an alkali metal or a compound containing an alkali earth metal.

Although it is preferable to select one from the group of a halide, an oxide, a nitride, a peroxide, and a metal salt as a compound containing an alkali metal and an alkali earth metal, it is more preferable that they are a halide or an oxide. Especially, as a compound containing an alkali metal having a melting point of less than 90° C., it is preferable to use KF (potassium fluoride) or CsF (cesium fluoride); and as a compound containing an alkali earth metal having a melting point of 90° C. or more, it is preferable to use, for example: NaF (sodium fluoride), LiF (lithium fluoride), $CaF_2$ (calcium fluoride), or $MgF_2$ (magnesium fluoride).

In the present invention, the electron injection layer may be formed by the following compounds each mixed in the same layer: at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more; and at least one selected from the group consisting of an alkali metal having a melting point of less than 90° C. and a compound containing an alkali metal having a melting point of less than 90° C. However, it is preferable that each of these compounds is separately used to form a first electron injection layer and a second electron injection layer. Further, it is more preferable that: the first electron injection layer is made of at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more; and the second electron injection layer is made of at least one selected from the group consisting of an alkali metal having a melting point of less than 90° C. and a compound containing an alkali metal having a melting point of less than 90° C. In this case, it is preferable that: the first electron injection layer, which is made of at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more, is formed adjacent to the electron transport layer at a side near to the cathode; and the second electron injection layer, which is made of at least one selected from the group consisting of an alkali metal having a melting point of less than 90° C. and a compound containing an alkali metal having a melting point of less than 90° C., is formed between the first electron injection layer and the cathode.

In the present invention, the thickness of the electron injection layer is preferably in the range of 0.5 nm-3.0 nm, and more preferably in the range of 1.0 nm-2.0 nm when the electron injection layer is formed as a mixed layer containing the following compounds: at least one selected from the group consisting of an alkali metal having a melting point of less than 90° C. and a compound containing an alkali metal having a melting point of less than 90° C.; and at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more. In addition, when at least one selected from the group consisting of an alkali metal having a melting point of less than 90° C. and a compound containing an alkali metal having a melting point of less than 90° C. is designated as "A"; and at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more is designated as "B", it is preferable that the mixing ratio of each compound (A:B) (in a volume conversion value) is preferably in the range of between 25:75 and 75:25.

Further, when two layers are separately formed as a first electron injection layer and a second electron injection layer, it is preferable that the thickness of the first electron is 0.1 nm-3.0 nm, and more preferably, it is 0.5 nm-2.0 nm. In the same way, the thickness of the second electron is preferably 0.1 nm-3.0 nm, and more preferably, it is 0.5 nm-2.0 nm.

It can form using a vacuum deposition method, for example, as a formation way of the electron injecting layer 14. The layer can be formed with a co-vacuum deposition method in the case of one of the embodiments of the present invention in which the electron injection layer is formed as a mixed layer containing the following compounds: at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more; and at least one selected from the group consisting of an alkali metal having a melting point of less than 90° C. and a compound containing an alkali metal having a melting point of less than 90° C. A co-vacuum deposition method is a technology which arranges two or more vacuum evaporation materials in the same chamber, and enables to vapor-deposit them simultaneously onto a common target substrate. By this method, since a vacuum evaporation rate can be set up for every material, composition control can be performed easily. It is preferable that the vacuum deposition is performed under a high vacuum condition ($10^{-4}$ Pa or less), and well-known technology, such as a resistive heating method and an electron beam method, can be used as a heating way.

(Substrate)

A substrate 11 applicable to the present invention is not specifically limited with respect to types of materials: such as glass or plastics. They may be transparent or opaque. A transparent substrate is preferable when the emitting light is taken from the side of substrate. Transparent substrates preferably utilized includes such as glass, quartz and transparent resin film. A specifically preferable substrate is a resin film capable of providing an organic EL element with a flexible property.

Examples of a resin film includes: polyesters such as polyethylene terephthalate (PET) and polyethylene naphthalate (PEN); polyethylene, polypropylene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefin resins such as ARTON (produced by JSR Co. Ltd.) and APEL (produce by Mitsui Chemicals, Inc.)

On the surface of a resin film, it may be formed a film incorporating an inorganic or an organic compound or a hybrid film incorporating both compounds. In is preferable to be a barrier film having a water vapor permeability of 0.01 g/(m$^2$·24 h) or less (temperature: 25±0.5° C.; and relative humidity: 90±2% RH) determined based on JIS K 7129-1992. Further, it is preferable to be a high barrier film having an oxygen permeability of $1\times10^{-3}$ cm$^3$/(m$^2$·24 h·MPa) or less determined based on JIS K 7126-1987, and having a water vapor permeability of $1\times10^{-5}$ g/(m$^2$·24 h) or less.

(Cathode)

As materials composing a cathode 15, metal, alloy, a conductive compound and a mixture thereof, which have a small work function (4 eV or less), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. A cathode can be prepared by forming a thin layer of these electrode substances with a method such as evaporation or sputtering. Further, the sheet resistance as a cathode is preferably a few hundreds Ω/□ or less and the layer thickness is generally selected in the range of 10 nm-5 μm and preferably of 50 nm-200 nm. In order to make transmit emitted light, either one of an anode or a cathode of an organic EL element is preferably transparent or translucent to improve the emission luminance.

(Anode)

An anode 12 preferably utilized are composed of metal, alloy, a conductive compound, which is provided with a large work function (4 eV or more), and a mixture thereof as an electrode substance. Specific examples of such an electrode substance include a conductive transparent material such as metal like Au, CuI, indium tin oxide (ITO), $SnO_2$ and ZnO. Further, a material such as $In_2O_3$—ZnO, which can prepare an amorphous and transparent electrode, may be also utilized.

As for an anode, these electrode substances may be made into a thin layer by a method such as evaporation or spattering and a pattern of a desired form may be formed by means of photolithography, or in the case of requirement of pattern precision is not so severe (about 100 μm or more), a pattern may be formed through a mask of a desired form at the time of evaporation or sputtering of the above-described substance. Alternatively, when coatable materials such as organic electrically conductive compounds are employed, it is possible to employ a wet system filming method such as a printing system or a coating system. When emission is taken out of this anode, the transmittance is preferably set to be 10% or more and the sheet resistance as an anode is preferably a few hundreds Ω/□ or less.

Further, although the layer thickness depends on a material, it is generally selected in the range of 10 nm-1,000 nm and preferably in the range of 10 nm 200 nm.
(Organic Layer)

Organic layers 13, which are composed of plural layers including mainly a hole transport layer, a light emitting layer and an electron transport layer, have a composition formed by laminating a plurality of organic compound layers. Besides a hole transport layer, a light emitting layer and an electron transport layer, other layers such as a hole injection layer, an electron blocking layer, a hole blocking layer and a buffer layer may be laminated in a suitable predetermined order.

Specific examples of a layer structure of organic layers relating to the present invention are cited as follows.

(1) Substrate/anode/hole transport layer/light emitting layer/electron transport layer/electron injection layer/cathode.

Figure 2A:
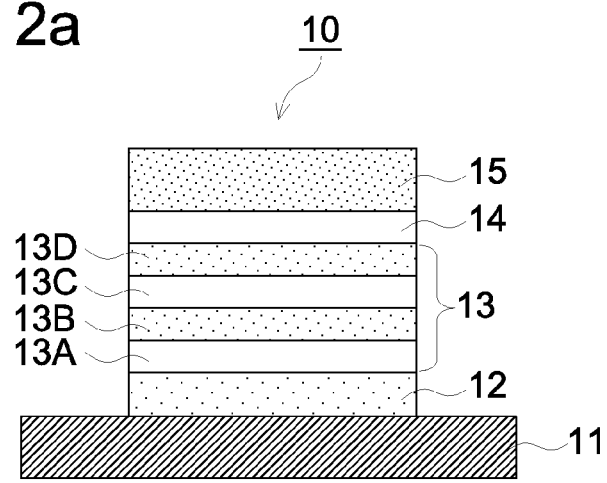
FIG. 2 is a schematic cross sectional view illustrating another example of compositions of an organic electroluminescence member.

(2) Substrate 11/anode 12/hole injection layer 13A/hole transport layer 13B/light emitting layer 13C/electron transport layer 13D/electron injection layer 14/cathode 15 (specific layer structure is illustrated in FIG. 2a).

(3) Substrate/anode/hole injection layer/hole transport layer/light emitting layer/hole blocking layer/electron transport layer/electron injection layer/cathode.

Figure 2B:
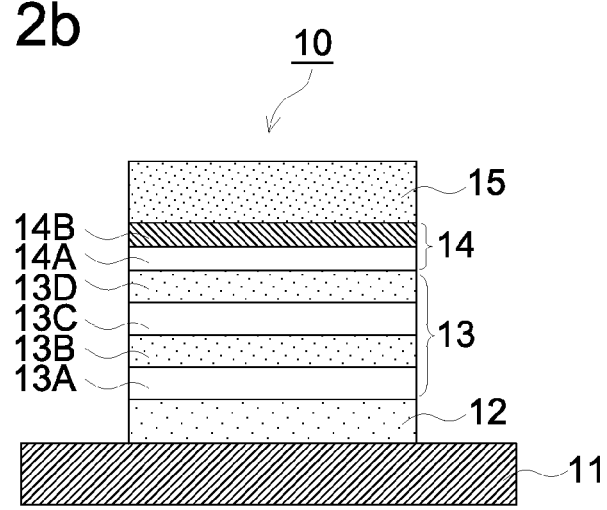

In the present invention, the electron injection layer is preferably composed of a first electron injection layer and a second electron injection layer: the first electron injection layer being formed of at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more; and the second electron injection layer being formed of at least one selected from the group consisting of an alkali metal having a melting point of less than 90° C. and a compound containing an alkali metal having a melting point of less than 90° C. This structure is shown in the following and in FIG. 2b. As illustrated in FIG. 2b, it is preferable that the first electron injection layer is formed adjacent to the electron transport layer at a side near to the cathode, and the second electron injection layer is formed between the first electron injection layer and the cathode.

(4) Substrate 111 anode 12/hole injection layer 13A/hole transport layer 13B/light emitting layer 13C/electron transport layer 13D/first electron injection layer 14A/second electron injection layer 14B/cathode 15.

In the following, there will be detailed a light emitting layer, an electron transport layer and other organic layers which constitute an organic electroluminescence member of the present invention

[Light Emitting Layer]

A light emitting layer is a layer which emits light via recombination of electrons and holes injected from electrodes, an electron transport layer or a hole transport layer. The light emission portion may be present either within the light emitting layer or at the interface between the light emitting layer and an adjacent layer thereof. The light emitting layer contains a host compound and a light emitting dopant (it is also called as a light emitting dopant compound), and it is preferable that light emission is carried out from the dopant.

The host compound may be selected from the known host compounds and it may be used singly. Further, plural hosts may be used in combination with. It is possible to control the transportation of charge carriers by making use of a plurality of host compounds, which results in high efficiency of an organic EL element. In addition, it is possible to mix a different emission lights by making use of a plurality of light emitting dopants as described later. Any required emission color can be obtained thereby.

An emission host may be a conventionally known low molecular weight compound, a polymer compound having a repeating unit, or a low molecular weight compound having a vinyl group or an epoxy group (vapor deposition polymerizable emission host). As specific known examples of a host compound, the compounds described in the following Documents are cited. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Next, an emission dopant used in an organic El member will be described.

As an emission dopant, it can be used a fluorescent compound, and a phosphorescent emitting material (it is also called as a phosphorescent compound or a phosphorescent emitting compound). As a phosphorescent emitting material, preferably it is a complex compound containing a metal of group 8 to 10 in the periodic table. More preferably, it is an iridium compound, an osmium compound, a platinum compound (a platinum complex compound), or a rare earth complex. Among these, a most preferable is an iridium compound.

In the following, specific examples of a phosphorescent emitting material are shown, however, the present invention is not limited to these. These compounds are synthesized with the method described, for example, in Inorg. Chem., vol. 40, 1704-1711.

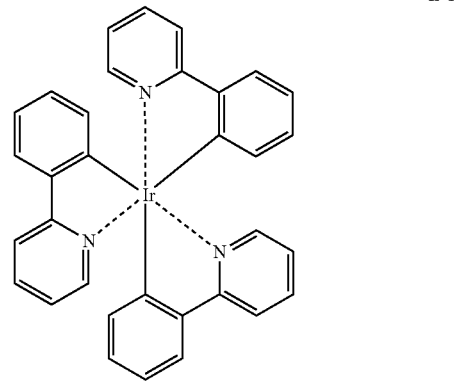

Ir-1

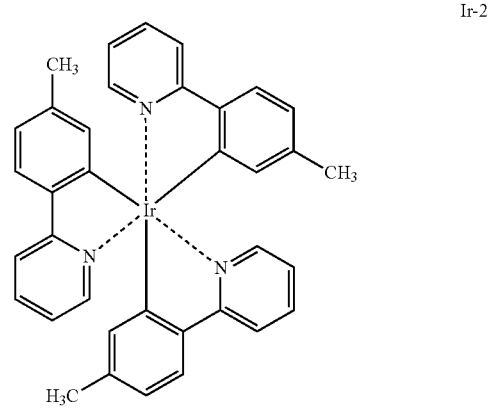

Ir-2

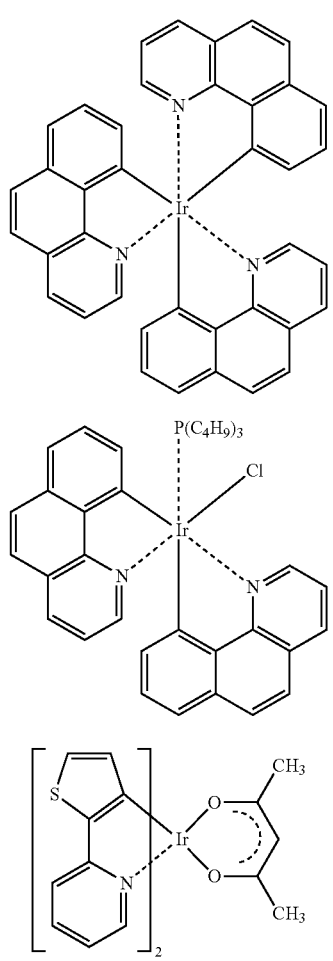 Ir-3
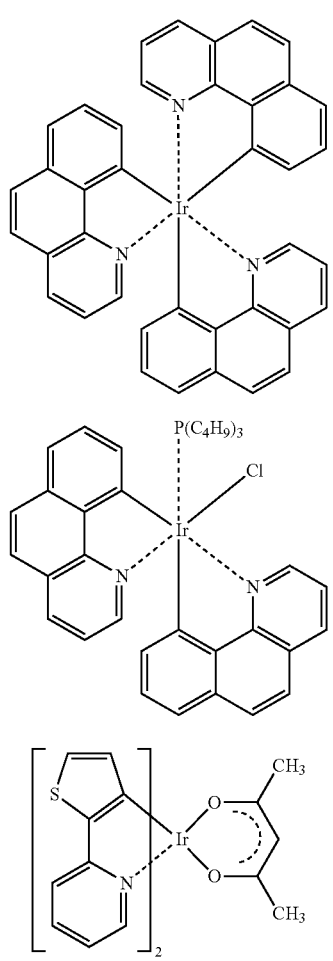 Ir-4
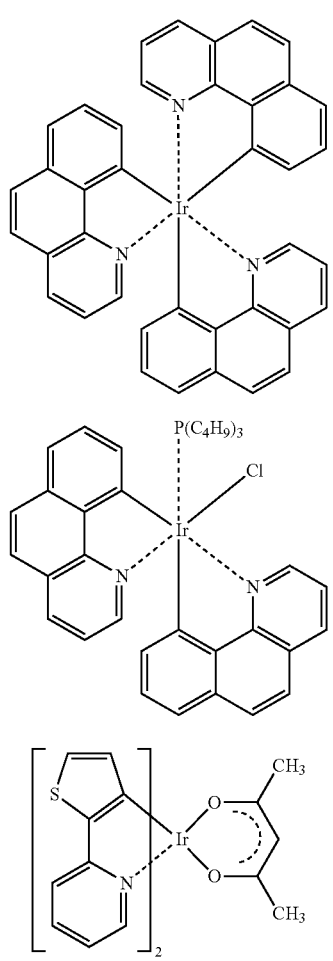 Ir-5
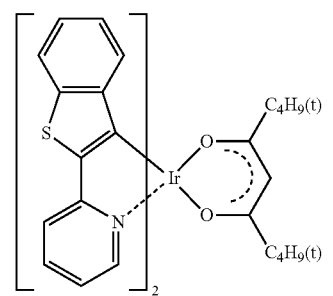 Ir-6
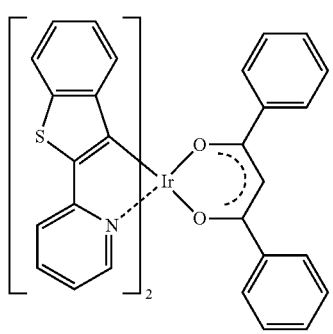 Ir-7
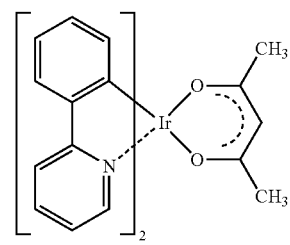 Ir-8
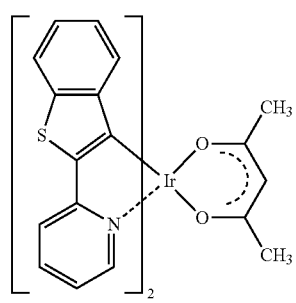 Ir-9
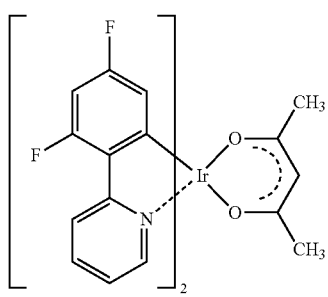 Ir-10
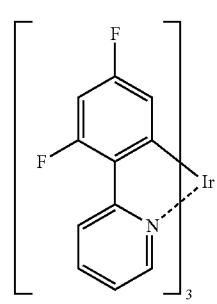 Ir-11
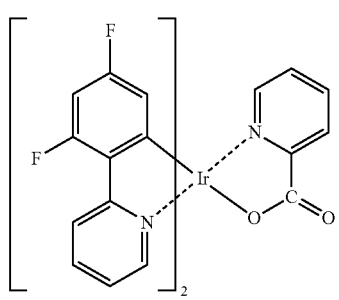 Ir-12

Ir-13
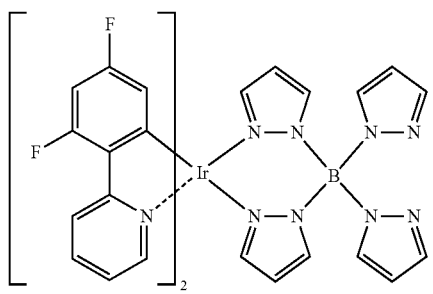
Ir-14
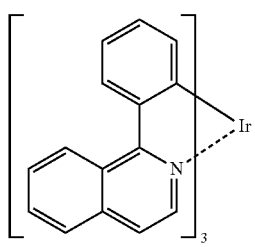
Pt-1
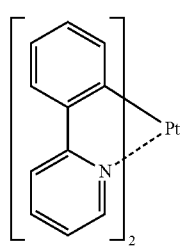
Pt-2
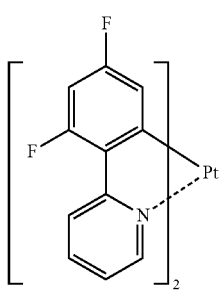
Pt-3
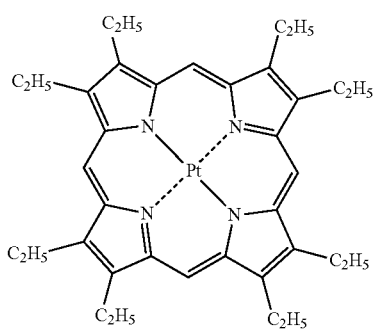
A-1
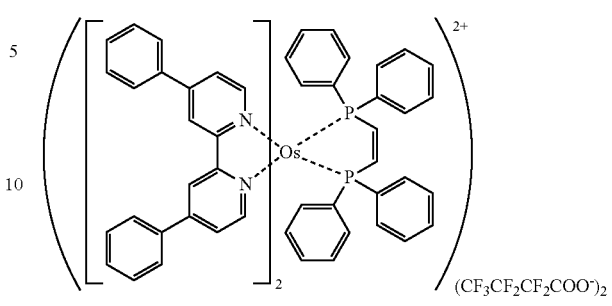
Ir-15
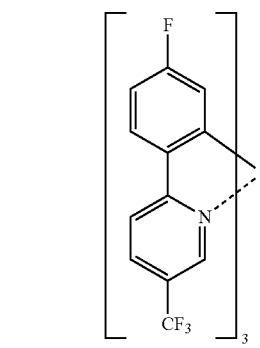
Ir-16
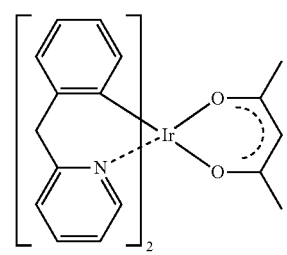
Ir-17
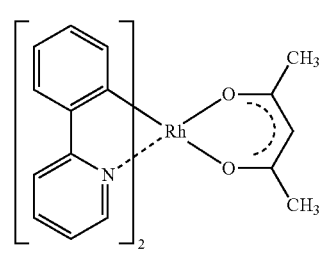
Rh-4

Rh-5

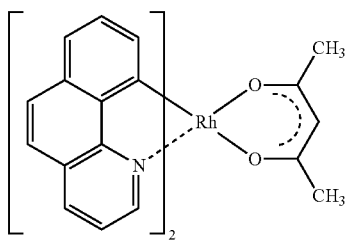

Rh-6

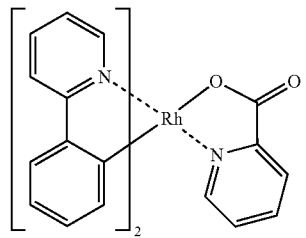

Pd-1

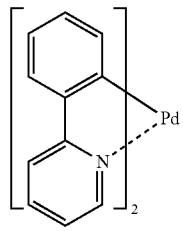

Pd-2

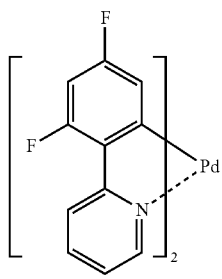

Pd-3

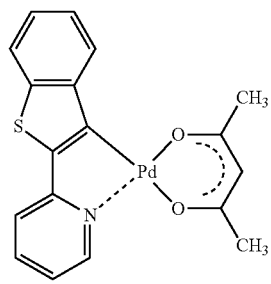

Rh-1

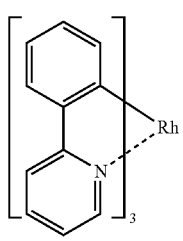

Rh-2

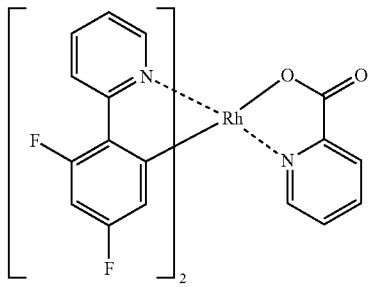

Rh-3

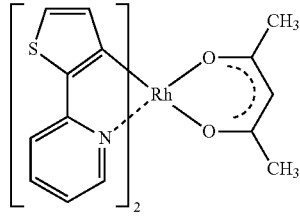

As typical examples of a fluorescent emitting material (a fluorescent dopant), there can be listed: compounds exhibiting a high fluorescent quantum efficiency such as laser dyes, coumarin based dyes, pyran based dyes, cyanine based dyes, croconium based dyes, squarylium based dyes, oxobenzanthracene based dyes, fluorescein based dyes, rhodamine based dyes, pyrylium based dyes, perylene based dyes, stilbene based dyes, polythiophene based dyes, and rare earth complex based fluorescent materials.

Further, conventionally known dopants can also be used in the present invention. For example, they are described in the following: WO 00/70655, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645, JP-A Nos. 2002-332291, 2002-50484, 2002-322292 and 2002-83684, Japanese Translation of PCT International Application Publication No. 2002-540572, JP-A Nos. 2002-117978, 2002-338588, 2002-170684 and 2002-352960, WO 01/93642, JP-A Nos. 2002-50483, 2002-100476, 2002-173674, 2002-359082, 2002-175884, 2002-363552, 2002-184582 and 2003-7469, Japanese Translation of PCT International Application Publication No. 2002-525808, JP-A 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

A thickness of a light emitting layer is not particularly limited. However, from the viewpoint of infirmity of the formed film, prevention of applying unnecessary high voltage at the time of light emission and stability of emission color with respect to a driving electric current, preferably, the thickness is adjusted in the range of 2 nm-200 nm, and more preferably, it is adjusted in the range of 5 nm-100 nm.

[Hole Injection Layer: (Anode Buffer Layer)]

In an organic EL member of the present invention, a hole injection layer is appropriately provided according to the necessity. It may be arranged between an anode and a light emitting layer or a hole transport layer. A hole injection layer (an anode buffer layer) is also detailed in such as JP-A Nos. 9-45479, 9-260062 and 8-288069. Specific examples thereof include such as a phthalocyanine buffer layer comprising such as copper phthalocyanine, an oxide buffer layer comprising such as vanadium oxide, an amorphous carbon buffer layer, and a polymer buffer layer employing conductive polymer such as polyaniline (or called as emeraldine) or polythiophene. A layer thickness of the hole injection layer is preferably adjusted in the range of 2 nm to 100 nm, although it depends on a raw material.

[Blocking Layer: Hole Blocking Layer, Electron Blocking Layer]

A blocking layer is appropriately provided in addition to the basic constitution layers composed of organic thin layers. Examples are described in such as JP-A Nos. 11-204258 and 11-204359 and p. 273 of "Organic EL Elements and Industrialization Front Thereof (Nov. 30 (1998), published by N. T. S Corp.)" is applicable to a hole blocking (hole block) layer according to the present invention.

A hole blocking layer, in a broad meaning, is provided with a function of electron transporting layer, being comprised of a material having a function of transporting an electron but a very small ability of transporting a hole. It can improve the recombination probability of an electron and a hole by inhibiting a hole while transporting an electron. Further, a constitution of an electron transport layer which will be described later can be appropriately utilized as a hole blocking layer according to necessity.

On the other hand, the electron blocking layer, as described herein, has a function of the hole transport layer in a broad sense, and it is composed of materials having markedly small capability of electron transporting, while having capability of transporting holes and enables to enhance the recombination probability of electrons and holes by inhibiting electrons, while transporting electrons. Further, it is possible to employ the constitution of the hole transport layer which will be described later, as an electron blocking layer when needed. A thickness of a hole blocking layer and an electron transport layer according to the present invention is preferably in the range of 3-100 nm, and more preferably it is in the range of 5-30 nm.

[Hole Transport Layer]

A hole transport layer contains a material having a function of transporting a hole, and in a broad meaning, a hole injection layer and an electron blocking layer are also included in a hole transporting layer. A single layer of or plural layers of a hole transporting layer may be provided.

A hole transport material is a compound having any one of a property to inject or transport a hole or a barrier property to an electron, and it may be either an organic substance or an inorganic substance. For example, listed are a triazole derivative, an oxadiazole derivative, an imidazole derivative, a polyarylalkane derivative, a pyrazoline derivative, a pyrazolone derivative, a phenylenediamine derivative, an arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or a conductive polymer such as polythiophene.

As a hole transport material, those described above can be utilized, however, it is preferable to utilized a porphyrin compound, an aromatic tertiary amine compound and a styrylamine compound, and specifically preferable is an aromatic tertiary amine compound.

Typical examples of an aromatic tertiary amine compound and a strylamine compound include: N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl) phenylinethane; bis(4-di-p-tolylaminophenyl) phenylmethane; N,N'-diphenyl-N,N'-di(4-methoxyphenyl)-4,4'-diaminobiphenyl; N,N,N',N'tetraphenyl-4,4'-diaminophenylether, 4,4'-bis(diphenylamino)quadriphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in the molecule described in U.S. Pat. No. 5,061,569, such as 4,4'-bis[N-(1-naphthyl)-N-phenylamino]biphenyl (abbreviation: NPD), and 4,4',4"-tris[N-(3-methylphenyl)-N-phenylamino]triphenylamine (abbreviation: MTDATA), in which three of triphenylamine units are bonded in a star burst form, described in JP-A No. 4-308688.

Polymer materials, in which these materials are introduced in a polymer chain or constitute the main chain of polymer, can be also utilized. Further, an inorganic compound such as a p type-Si and a p type-SiC can be utilized as a hole injection material and a hole transport material Further, it is possible to employ so-called p type hole transport materials, as described in a reference of J. Huang et al. (Applied Physics Letters 80 (2002), p. 139). A layer thickness of a hole transport layer is not specifically limited, however, it is generally 5 nm-5 μm, and preferably it is 5 nm-200 nm. This hole transport layer may have a single layer structure composed of two or more types of the above-described materials.

Further, it is possible to employ a hole transport layer having a higher p property which is doped with impurities. Listed examples thereof are those described in each of JP-A Nos. 4-297076, 2000-196140, 2001-102175, as well as in J. Appl. Phys., 95, 5773 (2004).

[Electron Transport Layer]

In the present invention, an electron transport layer is composed of a material having a function to transfer an electron, and an electron injection layer and a hole blocking layer are included in an electron transport layer in a broad meaning. A single layer or plural layers of an electron transporting layer may be provided.

Conventionally, when a single layered or a plural layered electron transport layer is provided, electron transport materials (they will function as a hole blocking material) are employed in an adjacent layer to the cathode side. And they are only required to have a function of transporting electrons ejected from the cathode to the light emitting layer. As such materials, any of the conventional compounds may be selected and employed. Examples of them include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. Further, as examples of an oxadiazole derivative described above, the following compounds can be used as an electron transport material: a thiadiazole derivative in which an oxygen atom in the oxadiazole ring is replaced with a sulfur atom; and a quinoxaline derivative which contains a quinoxaline ring known as an electron withdrawing group. Moreover, polymer materials, in which these materials are introduced in a polymer chain or these materials form the main chain of polymer, can be also utilized.

Further, a metal complex of a 8-quinolinol derivative such as tris(8-quinolinol)aluminum (abbreviation: Alq), tris(5,7-dichloro-8-quinolinol)aluminum, tris(5,7-dibromo-8-quinolinol)aluminum, tris(2-methyl-8-quinolinol)aluminum, tris (5-methyl-8-quinolinopaluminum and bis(8-quinolinol)zinc (abbreviation: Znq); and metal complexes in which a central metal of the aforesaid metal complexes is substituted by In, Mg, Cu, Ca, Sn, Ga or Pb, can be also utilized as an electron transport material. Further, metal-free or metal phthalocyanine, or a phthalocyanine derivative whose terminal is substituted by an alkyl group and a sulfonic acid group, can be preferably utilized as an electron transport material. In addition, a distyrylpyradine derivative which was cited as a light emitting material can be used as an electron transport material. Moreover, similarly to the case of a hole injection layer and to the case of a hole transport layer, an inorganic semiconductor such as an n-type-Si and an n-type-SiC can be also utilized as an electron transport material. A layer thickness of an electron transport layer is not specifically limited, however, it is generally 5 nm-5 μm, and preferably it is 5-200 nm. This electron transport layer may be a single layer containing two or more types of the above-described materials.

Further, it is possible to employ an electron transport layer having a higher n property which is doped with impurities. Listed examples thereof are those described in each of JP-A Nos. 4-297076, 10-270172, 2000-196140, 2001-102175, as well as in J. Appl. Phys., 95, 5773 (2004).

The organic materials use in each organic layer as described above are preferable to be selected from the compounds having a glass transition temperature of 90° C. or more, more preferably from the compounds having a glass transition temperature of 120° C. or more.

As a formation method of each of these organic layer, it can be used a vacuum deposition method or a wet coating method which is suitable to the organic materials for each layer.

Example of a wet coating method include: a spin coating method, a cast method, an ink-jet method, a spray method, a printing method and a slot die coater method. From the viewpoint of large sized production and high production yield, it is especially preferable to form a layer with methods such as an ink-jet method, a printing method, and a slot die coater method.

[Organic Electroluminescence Element]

Figure 3:
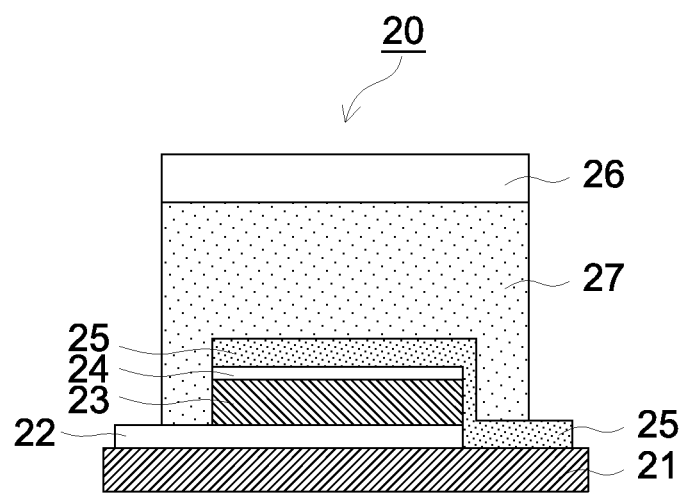
FIG. 3 is a schematic cross sectional view illustrating an example of compositions of an organic electroluminescence element.

FIG. 3 is a schematic cross sectional view illustrating an example of compositions of an organic electroluminescence element (hereafter, it is also called as an organic EL element) of the present invention.

In the following, an organic EL element having a close-contact sealing structure as illustrated in FIG. 3 will be described.

In FIG. 3, an organic EL element 20 contains an organic El element provided with a substrate 21, a anode 22, organic layers 23 composed of a plurality of layers containing a hole transport layer, a light emitting layer, and an electron transport layer, an electron injection layer 24 and a cathode 25. Each of these are respectively synonymous with the indication of numerals 11 to 15 in the aforesaid FIG. 1.

In FIG. 3, 26 is a sealing substrate, and 27 is an adhesive agent. An organic EL element of the present invention has a structure containing an organic EL member the surface of a cathode 25 is closely sealed with a sealing substrate 26 via an adhesive agent 27.

As a sealing structure of the organic EL element 20 of the present invention, it is preferable that the sealing substrate 26 is arranged to be closely contacted to cover the light emitting layer. Therefore, the sealing substrate 26 is preferably a flat structure.

Specific examples of a sealing substrate 26 include: glass plates, polymer plate-films, metal plates, and films. Specifically, it is possible to list, as glass plates, soda-lime glass, barium-strontium containing glass, lead glass, aluminosilicate glass, borosilicate glass, barium borosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, from the viewpoint of achieving an organic EL element to be a thin film, it is preferable to employ a metal film. When employing a metal film, an aluminium film is preferable by considering its easiness in processing and its economic aspect. A thickness thereof is about 1-100 μm, and preferably it is about 30 μm-50 μm. When employing a polymer film, the oxygen permeability of the polymer film is preferably $1 \times 10^{-3}$ ml/(m$^2$·24 h·MPa) or less, determined by the method based on JIS K 7126-1987, while its water vapor permeability (temperature: 25±0.5° C.; and relative humidity: 90±2% RH) is preferably $1 \times 10^{-3}$ g/(m$^2$·24 h) or less, determined by the method based on JIS K 7129-1992.

Examples of a resin to form the adhesive agent 27 include: a photo-radial polymerizable resin containing, as a main component, various acrylates such as polyester acrylate, a polyether acrylate, epoxy acrylate, or polyurethane acrylate; a photo-cationic polymerizable resin containing, as a main component, a resin such as an epoxy resin or a vinyl ether resin; a photo curable resin such as thiol-ene addition type resin; polyethylene, polypropylene, polyethylene terephthalate, polymethyl methacrylate, polystyrene, polyether sulfone, polyarylate, polycarbonate, polyurethane, acrylic resin, polyacrylonitrile resin, polyvinyl acetal, polyamide, polyimide, diacryl phthalate resin, cellulose system plastic, polyvinyl acetate, polyvinyl chloride, polyvinylidene chloride; and a thermo plastic resin or a thermo curable resin such as a copolymer made of two or more kinds of these resins.

In the present invention, it is preferable to use a thermo curable type adhesive agent from the viewpoint of luminescent property and manufacturing efficiency. It is preferable that the curing temperature to cure the heat curable adhesive agent is above 80° C. and below the glass transition temperature of an organic material used in an organic layer.

Moreover, a liquid type and a sheet type both can be used as an adhesive agent.

As for the thickness of an adhesive agent, it is preferable to be 5-100 μm for both of the liquid type and the sheet type in consideration of a hardening reaction time and an influence on an organic layer, penetration of water from an edge. As a way of arranging an adhesive agent and making it into a close-contact sealing structure, it can be dealt with the type of adhesive agent since the adhesive agents to be used may be a liquid type and a sheet-like type. For example, when an adhesive agent is a liquid type, an adhesive agent is coated beforehand on one side of a sealing substrate with a screen printing or a dispenser, subsequently, a sealing member is pasted so that the adhesive agent may touch the cathode side of an organic electroluminescence member, and thus a close-contact structure can be formed. In the case of a sheet type, a sheet form adhesive agent is cut into a required size beforehand. Then, if required, temporary lamination will be carried out to such an extent that complete cure is not beforehand carried out to one side of a sealing substrate, subsequently, a sealing member is pasted so that the adhesive agent may touch the cathode side of an organic electroluminescence component after that, and thus a close-contact structure can be formed.

In addition, before arranging an adhesive agent to a sealing substrate, in order to avoid adhesion of a foreign matter to a sealing substrate, it is preferable to clean it by an adhesion type roll cleaner, or by UV ozone washing.

Further, it is possible to disperse a desiccating agent in the adhesive agent. Examples of a desiccating agent include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). Anhydrides are suitably employed for sulfates, metal halides, and perchlorates.

During the time from arranging an adhesive agent to a curing process of the adhesive agent, it is important to maintain the water concentration and the oxygen concentration to be low from the viewpoint of preventing the lifetime decrease cause by deterioration of an organic EL element. It is preferable to carry out under an ambient with a water concentration of 10 ppm or less and an oxygen concentration of 10 ppm or less. As for pasting, it is preferable to carry out under the reduced pressure ambient of 1 Pa-30 kPa in consideration of mixing of an air bubble.

Moreover, as for the organic electronics component or the organic electroluminescence element of the present invention, it is preferable to carry out a heat treatment at a temperature of 80° C. or more and below the glass transition temperature of an organic material used for an organic layer after formation of an electronic injecting layer or after formation of a cathode. A heat treatment time is preferably 5 minutes or more and 5 hours or less, and more preferably, it is 10 minutes or more and 2 hours or less.

When a heat curing type adhesive agent is used at the above-mentioned sealing process, the heat treatment is preferably carried out together with a hardening process of a heat curing type adhesive agent in order to achieve high manufacturing efficiency.

EXAMPLES

The present invention will now be described with reference to examples, however the present invention is not limited thereto. In addition, an indication of "parts" or "%" will be used in examples, these represent "mass parts" or "mass %", respectively, without any specific notifications.

Example 1

Preparation of Organic EL Member

[Preparation of Organic EL Member 101]
(Preparation of Anode)

An anode was prepared by making patterning to a glass substrate (NA45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.
(Preparation of Hole Transport Layer)

On the transparent support substrate thus prepared was applied a 50% solution of poly(3,4-ethylenedioxythiphene)-polystyrene sulfonate (abbreviation: PEDOT/PSS, Baytron P AI 4083 made by Bayer AG.) diluted with water by using a spin coating method at 3,000 rpm for 30 seconds to form a film, and then, it was kept at 150° C. for 30 minutes. A hole transport layer having a thickness of 60 nm was thus prepared.

(Preparation of Light Emitting Layer)

The aforesaid substrate was transferred under an atmosphere of nitrogen (grade G1), the light emitting layer composition having the following composition was applied on the aforesaid hole transport layer by using a spin coating method at 1,500 rpm for 30 seconds to form a film, and then, it was kept at 120° C. for 30 minutes. A light emitting layer having a thickness of 60 nm was thus prepared.
(Light Emitting Layer Composition)

| | |
|---|---|
| Solvent: toluene | 100 mass % |
| Host material: H-A (glass transition temperature, 129 C. °) | 1 mass % |
| Blue material: Ir-A | 0.10 mass % |
| Green material: Ir(ppy)$_3$ | 0.004 mass % |
| Red material: Ir(piq)$_3$ | 0.005 mass % |

(Preparation of Electron Transport Layer)

Then, Alq$_3$ (glass transition temperature, 128 C°) and potassium fluoride each were placed in a tantalum resistance heating boat, and aluminium was placed in a tungsten resistance heating boat. They were fitted in a vacuum deposition apparatus. The substrate having been prepared until the aforesaid light emitting layer was transferred in the vacuum deposition apparatus without exposing to the air. Subsequently, after reducing the pressure of the vacuum tank to $5 \times 10^{-5}$ Pa, the aforesaid heating boat containing Alq$_3$ was heated via application of electric current at a vapor deposition rate of 0.15 nm/second to produce a layer having a thickness of 40 nm. Thus an electron transport layer was prepared.

(Preparation of Electron Injection Layer)

Then, the heating boat containing potassium fluoride was heated via application of electric current at a vapor deposition rate of 0.02 nm/second to produce a layer having a thickness of 2 nm. Thus an electron injection layer was prepared.

(Preparation of Cathode)

Subsequently, aluminium was vapor deposited with a thickness of 100 nm to prepare a cathode. Am organic EL member 101 was thus produced.

There are listed below the structures of each compound used for preparation of the aforesaid organic EL member 101.

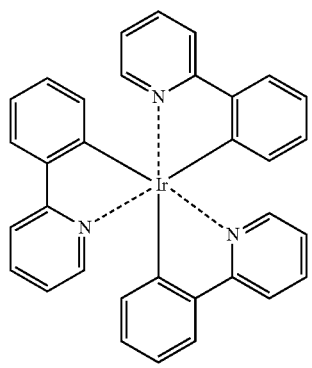

Ir(ppy)$_3$

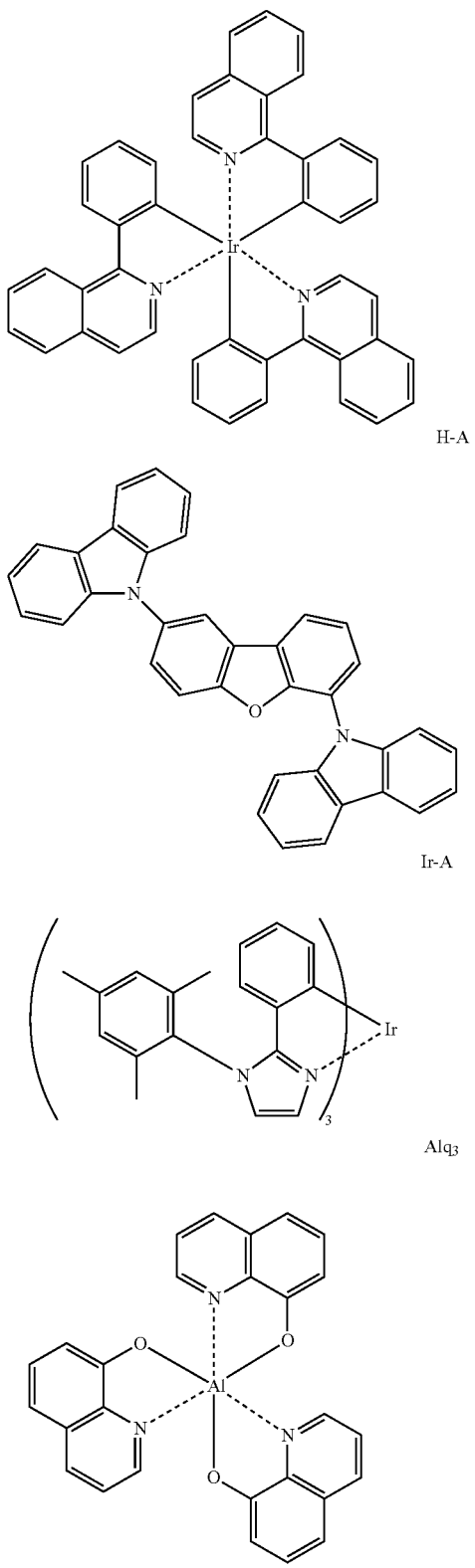

Ir(piq)₃

H-A

Ir-A

Alq₃

[Preparation of Organic EL Members 102-104]

Each electron injection material listed in Table 1 was placed in a tantalum resistance heating boat, and it was fitted in a vacuum deposition apparatus. Organic EL members 102-104 each were prepared in the same manner as preparation of the aforesaid Organic EL member 101, except performing the following change after formation of an electron transport layer made of Alq₃ having a thickness of 40 nm. An electron injection material listed in Table 1 was vapor deposited at 0.02 nm/second to obtain an electron injection layer having a thickness of 2 nm. In addition, the ratio of vapor deposition described in Table 1 is represented in a volume ratio.

[Preparation of Organic EL Members 105-111]

Two kinds of electron injection materials listed in Table 1 each were placed in a tantalum resistance heating boat, and they were fitted in a vacuum deposition apparatus. Organic EL members 105-111 each were prepared in the same manner as preparation of the aforesaid Organic EL member 101, except that after forming an electron transport layer made of Alq₃ having a thickness of 40 nm, the boats containing two kinds of electron injection materials were heated independently via application of electric current at 0.02 nm/second to co-deposit onto an electron transport layer to obtain an electron injection layer having a thickness of 2 nm.

[Preparation of Organic EL Member 112]

Lithium fluoride placed in a tantalum resistance heating boat was fitted in a vacuum deposition apparatus. Organic EL member 112 was prepared in the same manner as preparation of the aforesaid Organic EL member 101, except that the following after reducing the pressure of the vacuum tank to $5 \times 10^{-5}$ Pa, the heating boat containing Alq₃ and the heating boat containing lithium fluoride each were independently heated via application of electric current at a vapor deposition rate of 0.15 nm/second and 0.01 nm/second to co-deposit to produce an electron transport layer having a thickness of 40 nm; then, the boat containing potassium fluoride was heated via application of electric current at a vapor deposition rate of 0.02 nm/second to obtain an electron injection layer having a thickness of 2 nm; and subsequently, aluminium was vapor deposited to have a thickness of 100 nm to form a cathode. In addition, the ratio of vapor deposition described in Table 1 is represented in a volume ratio.

<<Evaluation of Organic EL Members>>

The prepared Organic EL members 101-112 described above were transferred in an atmosphere of a nitrogen gas (grade: G1) and they were left at 40° C. for 12 hours. Then, front luminance, driving voltage and lifetime property were evaluated under a nitrogen gas atmosphere.

(Evaluation of Front Luminance and Driving Voltage)

A front luminance was measured when the Organic EL member was applied with a constant electric current of 2.5 mA/cm² at 23° C. under a dry nitrogen gas atmosphere. The measurement was done using a speciroradiometric luminance meter CS-1000 (produced by Konica Minolta Sensing Inc.). The front luminance was represented as a relative value when the measured front luminance of Organic EL member 101 was set to be 100.

A driving voltage was measured when the front luminance became 1,000 cd/m².

(Evaluation of Lifetime Property)

The Organic EL member was driven with a constant electric current at 23° C. under a thy nitrogen gas atmosphere to give an initial front luminance of 1,000 cd. The time required for a decease in one half of the luminance was determined, and the resulting value was employed as an index of the lifetime in terms of a half lifetime (τ0.5).

The measurement was done using a spectroradiometric luminance meter CS-1000 (produced by Konica Minolta Sensing Inc.). It was represented as a relative value when the measured value of Organic EL member 101 was set to be 100.

The evaluation results thus obtained are shown in Table 1.

TABLE 1

| Organic EL member No. | Electron transfer layer | | | Electron injection layer | | | Evaluation results | | | |
|---|---|---|---|---|---|---|---|---|---|---|
| | Material | Vapor evaporation ratio | Layer thickness (nm) | Material | Vapor evaporation ratio | Layer thickness (nm) | Surface luminance (relative value) | Driving voltage (V) | Lifetime property (relative value) | Remarks |
| 101 | Alq$_3$ | — | 40 | KF | — | 2 | 100 | 8.0 | 100 | Comp. |
| 102 | Alq$_3$ | — | 40 | NaF | — | 2 | 110 | 10.2 | 70 | Comp. |
| 103 | Alq$_3$ | — | 40 | CsF | — | 2 | 95 | 7.7 | 110 | Comp. |
| 104 | Alq$_3$ | — | 40 | LiF | — | 2 | 105 | 11.4 | 60 | Comp. |
| 105 | Alq$_3$ | — | 40 | LiF•NaF | 1:1 | 2 | 108 | 10.8 | 65 | Comp. |
| 106 | Alq$_3$ | — | 40 | KF•CsF | 1:1 | 2 | 98 | 7.9 | 105 | Comp. |
| 107 | Alq$_3$ | — | 40 | KF•NaF | 1:1 | 2 | 130 | 7.3 | 140 | Inv. |
| 108 | Alq$_3$ | — | 40 | KF•LiF | 1:1 | 2 | 125 | 8.2 | 135 | Inv. |
| 109 | Alq$_3$ | — | 40 | KF•CaF$_2$ | 1:1 | 2 | 115 | 8.6 | 125 | Inv. |
| 110 | Alq$_3$ | — | 40 | KF•MgF$_2$ | 1:1 | 2 | 107 | 9.0 | 110 | Inv. |
| 111 | Alq$_3$ | — | 40 | CsF•LiF | 1:1 | 2 | 120 | 7.9 | 137 | Inv. |
| 112 | Alq$_3$•LiF | 1:0.067 | 40 | KF | — | 2 | 105 | 7.8 | 90 | Comp. |

Comp.: Comparative example,
Inv.: Present invention

As clearly shown by the results described in Table 1, it is evident that the organic El members of the present invention exhibited a high front luminance with a low voltage and excellent in lifetime property even after exposed in a high temperature condition.

Example 2

Preparation of Organic EL Member

[Preparation of Organic EL Member 201]

Organic EL member 201 was prepared in the same manner as preparation of Organic EL member 107 described in Example 1, except performing the following change after formation of a light emitting layer. Alq$_3$ (glass transition temperature, 128 C°), potassium fluoride, and sodium fluoride each were placed in a tantalum resistance heating boat, and aluminium was placed in a tungsten resistance heating boat. They were fitted in a vacuum deposition apparatus. The substrate having been prepared until the light emitting layer was transferred in the vacuum deposition apparatus without exposing to the air. Subsequently, after reducing the pressure of the vacuum tank to 5×10$^{-5}$ Pa, the heating boat containing Alq$_3$ was heated via application of electric current at a vapor deposition rate of 0.15 nm/second to produce a layer having a thickness of 40 nm. Thus an electron transport layer was prepared. Then, the heating boat containing sodium fluoride was heated via application of electric current at a vapor deposition rate of 0.02 nm/second to produce a layer having a thickness of 1 nm. Thus a first electron injection layer was prepared. Then, the heating boat containing potassium fluoride was heated via application of electric current at a vapor deposition rate of 0.02 nm/second to produce a layer having a thickness of 1 nm. Thus a second electron injection layer was prepared. Subsequently, aluminium was vapor deposited with a thickness of 100 nm to prepare a cathode. Am organic EL member 201 was thus produced.

<<Evaluation of Organic EL Member>>

The prepared Organic EL member 201 described above was transferred in a nitrogen gas (grade: G1) atmosphere in the same manner as described in Example 1. After leaving it at 40° C. for 12 hours, front luminance, driving voltage and lifetime property were evaluated under a nitrogen gas atmosphere in the same manner. The obtained evaluation results are shown in Table 2 with the results of Organic EL member 107.

TABLE 2

| Organic EL member No. | First electron injection layer | | Second electron injection layer | | Evaluation results | | | |
|---|---|---|---|---|---|---|---|---|
| | Material | Layer thickness (nm) | Material | Layer thickness (nm) | Surface luminance (relative value) | Driving voltage (V) | Lifetime property (relative value) | Remarks |
| 107 | KF•NaF | 2 | — | — | 130 | 7.3 | 140 | Present invention |
| 201 | NaF | 1 | KF | 1 | 140 | 7.0 | 150 | Present invention |

As clearly shown by the results described in Table 2, it is evident that Organic El member 201 of the present invention exhibited a higher front luminance with a lower voltage and more excellent in lifetime property even after exposed in a high temperature condition compared with Organic El member 107. Organic El member 201 is provided with two electron injection layers. One of which is a first electron injection layer made of sodium fluoride derived from an alkali metal of sodium having a melting point of larger than 90° C., and it is located adjacent to an electron transport layer. The other of which is a second electron injection layer made of potassium fluoride derived from an alkali metal of sodium having a melting point of larger than 90 C, and it is located between the first electron injection layer and the cathode.

Example 3

Preparation of Organic EL Member

[Preparation of Organic EL Member 301]

Organic EL member 301 was prepared in the same manner as preparation of Organic EL member 201 described in Example 2, except that the sample was heated at 100° C. for 30 minutes after formation of a cathode.

[Preparation of Organic EL Member 302]

Organic EL member 302 was prepared in the same manner as preparation of Organic EL member 201 described in Example 2, except that the following change was made. The sample was transferred under a nitrogen gas atmosphere after formation of a second electron injection layer, and it was heated at 100° C. for 30 minutes. Then, it was restored in the vacuum deposition apparatus and aluminium was vapor deposited to have a thickness of 100 nm to form a cathode.

<<Evaluation of Organic EL Member>>

The prepared Organic EL members 301 and 302 described above were transferred in a nitrogen gas (grade: G1) atmosphere in the same manner as described in Example 1. After leaving them at 40° C. for 12 hours, front luminance, driving voltage and lifetime property were evaluated under a nitrogen gas atmosphere in the same manner. The obtained evaluation results are shown in Table 3 with the results of Organic EL member 201 prepared in Example 2.

TABLE 3

| Organic EL member No. | Heating treatment | Evaluation results | | | Remarks |
|---|---|---|---|---|---|
| | | Surface luminance (relative value) | Driving voltage (V) | Lifetime property (relative value) | |
| 201 | — | 140 | 7.0 | 150 | Present invention |
| 301 | After formation of cathode, heating treatment at 30° C. for 30 minutes | 144 | 6.8 | 157 | Present invention |
| 302 | After formation of second electron injection layer, heating treatment at 30° C. for 30 minutes | 143 | 6.9 | 160 | Present invention |

As clearly shown by the results described in Table 3, it is evident that Organic El members composed of the present invention, which were subjected to heating treatment after formation of an electron injection layer, or after formation of a cathode, exhibited a higher front luminance with a lower voltage and more excellent in lifetime property even after exposed in a high temperature condition compared with Organic El member 201.

Example 4

Preparation of Organic EL Element

Organic EL element 401 was prepared by sealing Organic EL member 201 described in Example 2 under a nitrogen gas atmosphere according to the following method.

(Sealing)

A sealing substrate made of glass was used. After cutting it in a size capable of covering the light emitting region of the sample, a heat curing type liquid adhesive agent (epoxy resin system) was completely applied with a screen printing method onto one surface of the substrate to have a thickness of 30 μm. Then, it was stuck so that the light emitting region and the circumference of the light emitting region of the prepared Organic EL member 201 were covered and carried out a heat-curing treatment at 100° C. for 30 minutes.

The prepared Organic EL element 401 was evaluated in the same manner as done in Example 1. A front luminance, a driving voltage and a lifetime property under a high temperature condition were evaluated. It was revealed that Organic EL element 401 exhibited almost the same excellent properties as Organic EL member 301 in Example 3.

By carrying out a heating treatment of Organic EL member 201 at the time of sealing process, it was confirmed that the production efficiency was improved as well as the improvement of a front luminance, a driving voltage and a lifetime property under a high temperature condition.

DESCRIPTION OF SYMBOLS

10: Organic EL member
11, 21: Substrate
12, 22: Anode
13, 23: Organic layer
13A: Hole injection layer
13B: Hole transport layer
13C: Light emitting layer
13D: Electron transport layer
14, 24: Electron injection layer
14A: First electron injection layer
14B: Second electron injection layer
15, 25: Cathode
26: Sealing substrate
27: Adhesive agent

What is claimed is:

1. An organic electroluminescence member comprising:
a substrate havening thereon an anode, a cathode, a plurality of organic layers including a hole transport layer, a light emitting later and an electron transport layer, the plurality of organic layers being sandwiched between the anode and the cathode, and an electron injection layer located between the electron transport layer and the cathode,
wherein the electron injection layer is formed only with:
at least one selected from the group consisting of an alkali metal having a melting point of less than 90° C. and a compound containing an alkali metal having a melting point of less than 90° C.; and
at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more.

2. The organic electroluminescence member described in claim 1,
wherein the electron injection layer is composed of a first electron injection layer and a second electron injection layer: the first electron injection layer being formed of at least one selected from the group consisting of an alkali metal having a melting point of 90° C. or more, an alkali earth metal having a melting point of 90° C. or more, a compound containing an alkali metal having a melting point of 90° C. or more, and a compound containing an alkali earth metal having a melting point of 90° C. or more; and the second electron injection layer being formed of at least one selected from the group consisting of an alkali metal having a melting point of less than 90° C. and a compound containing an alkali metal having a melting point of less than 90° C.

3. The organic electroluminescence member described in claim 2,
wherein the first electron injection layer is formed adjacent to the electron transport layer at a side near to the cathode, and the second electron injection layer is formed between the first electron injection layer and the cathode.

4. The organic electroluminescence member described in claim 1,
wherein a heat treatment is carried out to the organic electroluminescence member after forming the electron injection layer, or after forming the cathode, the heat treatment being carried out at a temperature of 80° C. or more and below a glass transition temperature of an organic material used in the organic layer.

5. A method for producing an organic electroluminescence element comprising the steps of:
pasting together a sealing member having a heat curable adhesive agent on a sealing substrate with the organic electroluminescence member described in claim 1 in a manner that a surface of the heat curable adhesive agent have contact with a surface of the cathode of the organic electroluminescence member;
carrying out a heat treatment at a temperature of 80° C. or more and below a glass transition temperature of an organic material used in the organic layer; then
curing the heat curable adhesive agent to form a close-contact sealing structure.

* * * * *